United States Patent [19]

Assar et al.

[11] Patent Number: 5,596,526

[45] Date of Patent: Jan. 21, 1997

[54] NON-VOLATILE MEMORY SYSTEM OF MULTI-LEVEL TRANSISTOR CELLS AND METHODS USING SAME

[75] Inventors: Mahmud Assar, Morgan Hill; Parviz Keshtbod, Los Altos Hills, both of Calif.

[73] Assignee: Lexar Microsystems, Inc., Fremont, Calif.

[21] Appl. No.: 515,188

[22] Filed: Aug. 15, 1995

[51] Int. Cl.[6] .................................................. G11C 11/34
[52] U.S. Cl. .................... 365/185.17; 365/104; 365/184; 365/185.03; 365/185.24
[58] Field of Search ..................................... 365/184, 104, 365/185.03, 185.17, 185.24

[56] References Cited

U.S. PATENT DOCUMENTS 4,586,163  4/1986  Koike ........................................ 365/184
5,163,021  11/1992  Mehrotra et al. ................... 365/185.03

Primary Examiner—David C. Nelms
Assistant Examiner—F. Niranjan
Attorney, Agent, or Firm—Maryam Imam; Steven Shaw

[57] ABSTRACT

A multi-level NAND architecture non-volatile memory device reads and programs memory cells, each cell storing more than one bit of data, by comparing to a constant current level while selectively adjusting the gate voltage on the cell or cells being read or programmed. A plurality of read and write reference cells are provided each programmed to correspond to one each of the multi-level programming wherein during reading of the memory cells, the read reference cells provide the constant current level and during writing to the memory cells, the write reference cells provide the same. Furthermore, during a read operation, corresponding write reference cells are coupled to read reference cells to gauge the reading time associated with reading of memory cells.

28 Claims, 8 Drawing Sheets

"0" positive threshold
"1" negative threshold 2-bit Register and
2-bit Comparator

1

NON-VOLATILE MEMORY SYSTEM OF MULTI-LEVEL TRANSISTOR CELLS AND METHODS USING SAME

FIELD OF THE INVENTION

This invention relates to the field of multi-level storage in the EEPROM memory technology. More particularly, this invention is a method apparatus for storing into and reading several bits of information out of a single NAND type EEPROM memory cell.

BACKGROUND OF THE INVENTION

Early non-volatile memory technology provided for either programming or erasing a floating gate. Because such transistors were selectively in one of two states, programmed or erased, a single bit of data could be programmed. It is known that more than one bit of information can be stored in a single non-volatile cell. Such data storage is normally accomplished by carefully placing a specific amount of charge on a floating gate of a transistor to control its threshold voltage. As is known, at least four distinct states must be provided to store two bits of data, at least eight states for 3 bits and so forth. A sense amplifier is provided to detect the cell current corresponding to those thresholds to decode the bits.

There are two conventional EEPROM architectures for constructing memory arrays of the type that incorporate non-volatile transistor memory cells: NOR and NAND architectures. In an EEPROM NOR type architecture, each transistor memory cell is provided its own select transistor. Accordingly, with the NOR there is no interference from other cells in the memory array during program and read operations. As such, it is easier to design a circuit to program and sense multiple levels of programming using NOR type architecture. Unfortunately, because each storage cell requires its own select transistor, the area per bit size is large and costly.

One prior art reference teaches an apparatus which provides up to eight bits of information (256 analog levels) and a method for programming and detecting this information using a NOR type EEPROM memory cell which uses Fowler-Nordheim tunneling. Programming this type of cell can be done by incremental programming. In other words, a certain amount of charge is stored on the floating gate. The cell current is then verified against a predetermined reference current. If the cell current is not within an acceptable variance from the reference current, a small amount of charge is removed from the floating gate and the cycle is repeated until the cell current and reference currents are substantially equal. Because the threshold voltage for a cell is reduced by this procedure of successively removing charge from the floating gate, the cell current will initially be lower than the reference current. Once the cell current is incrementally above the reference current, the programming operation will cease.

According to another prior art reference, two bits (four analog levels) are stored on a NOR type EPROM memory cell which uses Hot Channel Electron Injection for programming. Because this programming technique is more difficult to control, it becomes increasingly more difficult to store more than four levels on a single cell. Additionally, the prior art teaches that the gates of the storage cells are all applied with a constant gate voltage. The current drawn by the cells is measured to determine which level the cell is programmed. In an embodiment introduced by Intel Corporation of Santa Clara, Calif., the level of the cell is determined by applying a known and constant gate voltage to the cell. The cell is designed to draw current within a specified range depending upon the level of programming of the floating gate. A sense amplifier is coupled to determine whether the current drawn by the accessed cell is over or under the mid-point of the current range. Once that determination is made, one of two additional sense amplifiers is used to determine whether the current drawn by the cell is over or under one-fourth or three-fourths of the range as appropriate, and so on, until the amount of current drawn by the accessed cells is found to fall within a corresponding current range.

A NAND EEPROM type architecture uses several cells in series as each group shares a bit-line contact with an adjacent group. In this way, only two select transistors are needed for the entire group using the NAND architecture. By eliminating all but two select transistors for each group, significantly greater storage cell density is achieved. This is in marked contrast to the NOR architecture where each cell has its own select transistor and shares one contact between two adjacent cells.

A problem which exists in a NAND type architecture is the current that is detected during a read or a program verify operation of a single cell is influenced by the threshold value of all the other cells in the group. After accurately programming a cell, subsequent programming of the other cells within the group could adversely change the current detected and make it very difficult to differentiate its level from adjacent program levels. This level of interference can be tolerated for a single bit (two levels) programming but makes it very difficult to reliably store and detect more levels.

What is needed is a multi-level non-volatile storage architecture that allows the use of NAND type configuration, yet avoids the pitfalls of intragroup interference.

BRIEF SUMMARY OF THE INVENTION

This invention describes a reliable architecture for and method of programming and reading a multi-level non-volatile NAND memory array. In the preferred embodiment, each cell stores two data bits which requires four distinct levels of programming. The NAND cells are formed of an EEPROM technology. The architecture includes 16 series connected transistors in each group. This technique can easily be modified to accommodate more than two bits per cell.

Read and write reference blocks each having four columns of cells are programmed for reference, each column holding one out of four distinct program levels. Therefore, all reference cells are available for every row of each block in the array. For additional accuracy and tracking, the reference blocks can be repeated throughout the memory array so that each block of 16 rows will have a corresponding reference block. During a memory read cycle, the level of programming is determined by comparing the current through each memory cell being read to the current of all of the corresponding read reference cells. Once the programmed level is determined, the data bit is decoded and output. During a memory program cycle, all of the cells within the memory array are programmed and verified against the write reference cells.

Four read and four write reference cells are provided for each row of memory cells in the array blocks. Each reference cell is configured to correspond to the four distinct levels of programming. A sense amplifier sequentially compares the current through a memory cell to the current through each of the corresponding reference cells to determine the level of programming and thus the programmed bits.

The threshold voltage of an erased cell is approximately −2 V. During a programming cycle, the cells are programmed in small increments. As the threshold voltage is increased the cell current drops and is compared to the current in a write reference cell. If the cell has to be programmed to one of the higher threshold levels, this procedure is repeated and compared with the corresponding write reference cell until the desired level of programming is achieved.

BRIEF DESCRIPTIONS OF THE DRAWINGS

DETAILED DESCRIPTION OF THE INVENTION

Figure 1:
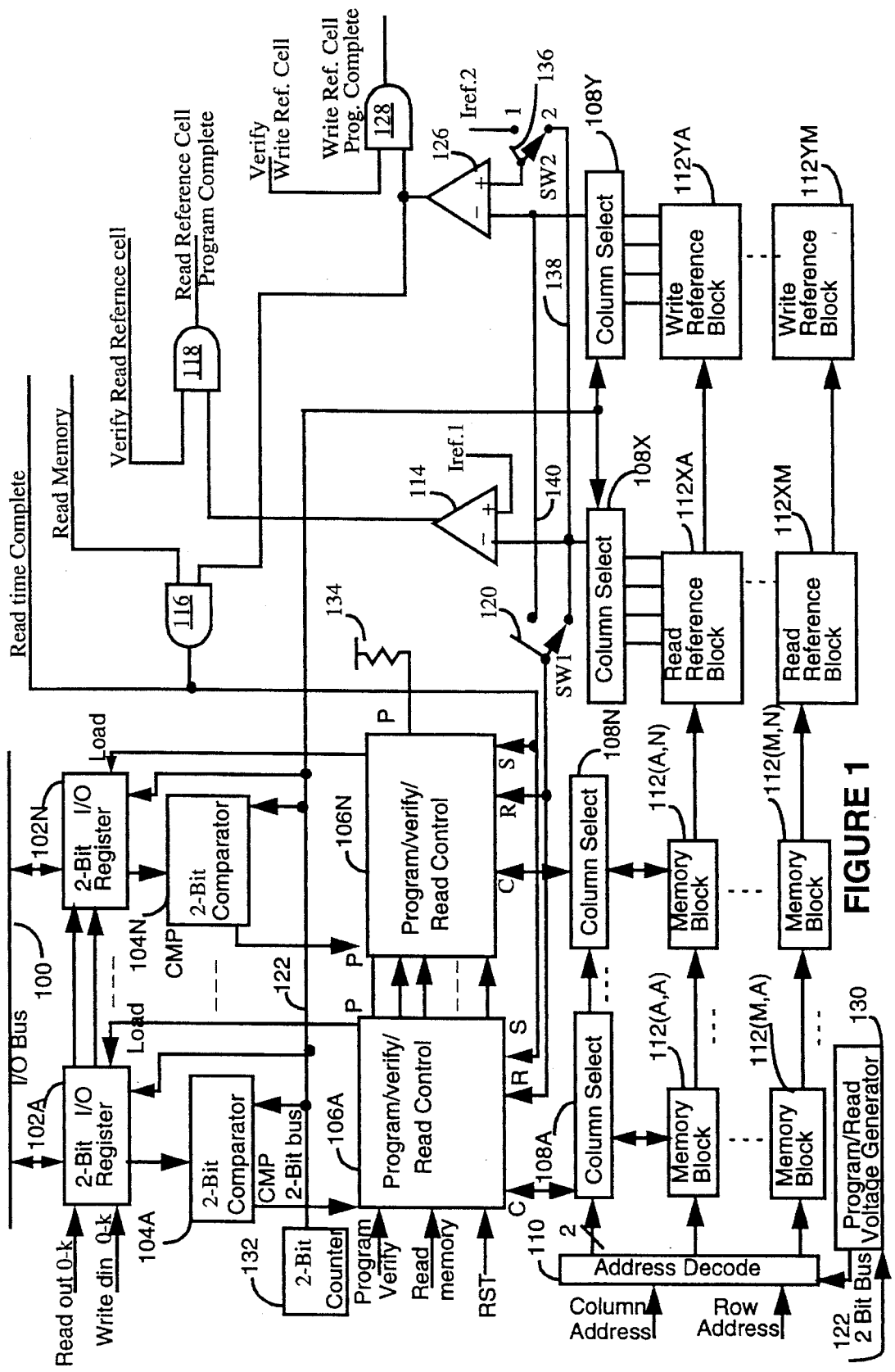
FIG. 1 illustrates a block diagram of the preferred embodiment for an array of memory blocks.

FIG. 1 shows a block diagram of the preferred embodiment of the present invention. It will be apparent to those of ordinary skill in the art that the memory array can be expanded to accommodate a storage space of any size. In this description of the preferred embodiment, it will be understood that there are many identical elements. Such elements will be referred to using the same reference numeral with an alphabetic suffix. When multiple or all such elements are being referred to in a general way, the reference numeral will be used without any suffix.

Data is coupled to the apparatus of the present invention via an I/O bus 100. According to the preferred embodiment a plurality of 2-bit I/O registers 102A–102N are coupled to receive and send data between the I/O bus 100 and the remainder of the memory. For other constructions using differing number of storage levels, other numbers of bits can be coupled throughout the I/O registers 102.

Each 2-bit comparator 104A–104N receives and compares data from an appropriate one of the 2-bit I/O registers 102 and the 2-bit bus 122. Each 2-bit comparator 104A–104N is also coupled to provide a compare signal CMP to a program/ verify/read (PVR) control block 106A–106N, respectively. Each PVR block 106A–106N is also bi-directionally coupled to a column select block 108A–108N, respectively. Each of the column select blocks 108 is coupled to select within a memory array block 112. An address decoder 110 is also coupled to the column select blocks 108 and to the memory array block 112(A,A)–112(M, N). A prog./read voltage generator block 130 is coupled to address decoder 110 to provide the appropriate row voltage during read and program verification operations using the 2-bit bus 122.

In addition to the memory array there is read reference and write reference blocks. A column select 108X is provided for selecting among the read reference cells, and a column select block 108Y is provided for selecting among the write reference cells using the 2-bit bus 122. The address decoder 110 provides the row select of both read and write reference blocks. Address decoder 110 in addition selects the row and column of memory blocks 112(A,A)–112(M,N).

The read reference array blocks 112X are coupled to a first input of a sense amplifier 114 through column select 108X and selectively to the PVR blocks 106 through switch SW1 120 when SW1 is in position 2. The sense amplifier 114 is coupled to compare the output of the read reference array blocks 112X against a reference current Iref1. The output of the sense amplifier 114 is coupled to a 2-input AND gate 118. AND gate 118 is also coupled to receive a Verify Read Reference Cell signal. The output of AND gate 118 is Read Reference Cell Program Complete signal. This portion of the circuitry is used during a setup phase for programming the read reference cells to the desired levels.

The write reference array blocks 112Y are coupled to a first input of a sense amplifier 126 through column select 108Y and 140. The second input of sense amplifier 126 is selectively coupled to receive either a reference current Iref2 or the output of read reference column select 138. SW2 136 provides the switching between Iref2 in position 1 or 138 in position 2 as input to the sense amplifier 126. The output of sense amplifier 126 is connected to a 2-input AND gate 128 which receives its other input from Verify Write Reference Cell signal. This portion of the circuitry is used during programming of the write reference cells to the desired levels. Throughout the description of the invention hereafter, programming or writing of the memory cells are used interchangeably to describe the same operation, i.e. programming of the memory cells. Furthermore, read, verify and write operations will be described relative to memory cells, read reference cells, and write reference cells. However, it should be understood that some of these operations are distinctly separate and independent operations. In particular, four operations will be described in detail consisting of: 1) programming of write reference cells, 2) programming of read reference cells, 3) programming and verification of memory cells and 4) reading of memory cells.

Figure 2:
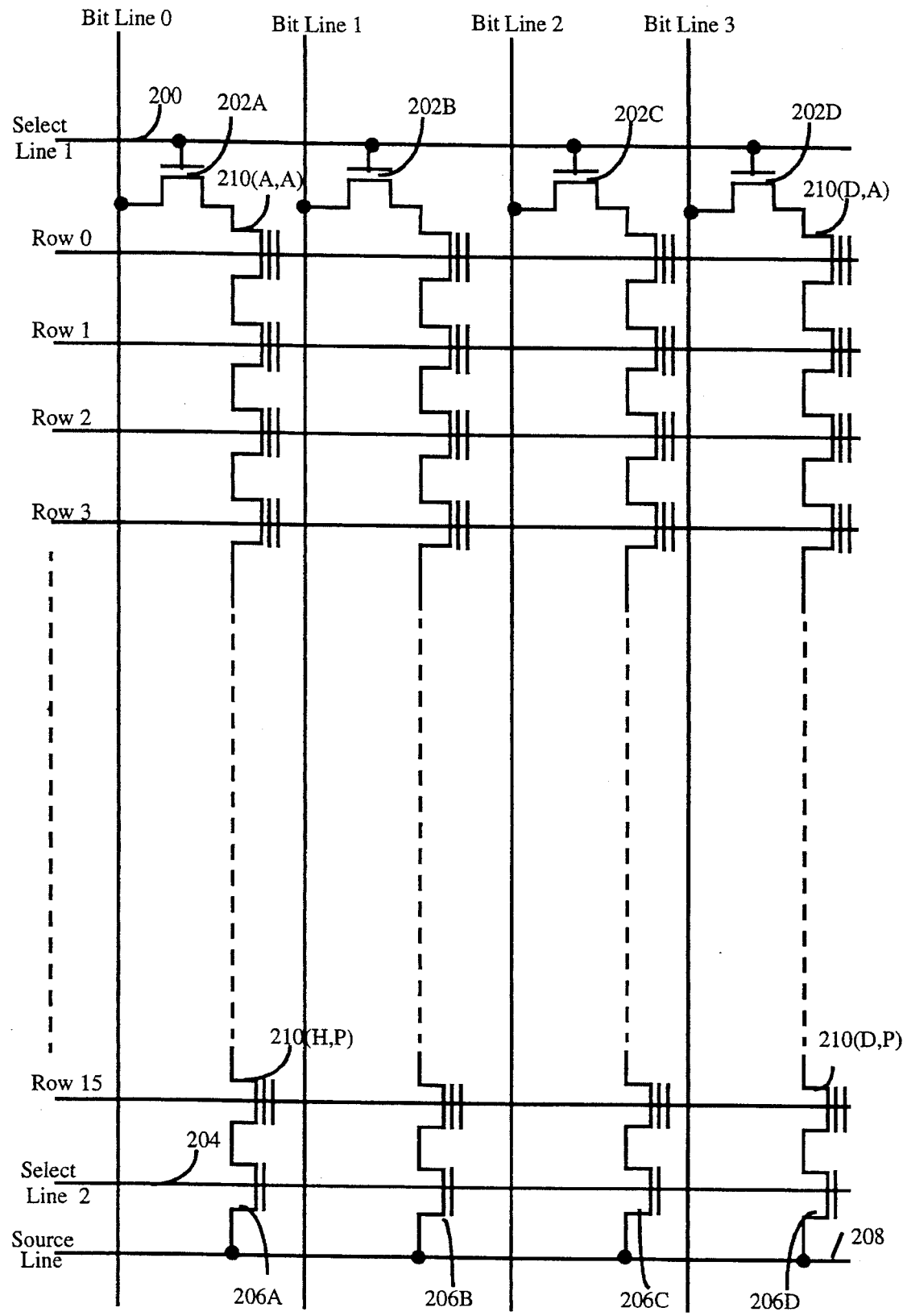
FIG. 2 shows a typical memory block used in FIG. 1.

Each of memory, read reference, and write reference blocks includes a plurality of EEPROM cells connected in a NAND-type architecture, as shown in FIG. 2. According to the present invention, two bits of data are stored into each of the EEPROM transistor storage cells 210A,A through 210D, P. To achieve this, four unique gate voltage levels are used. Cells of memory array blocks 112 A,A–112 M,N are programmed and compared against the current through the appropriate write reference cell during programming of the memory cells and compared against the current through the appropriate read reference cell during reading. Once the cell current is incrementally smaller than the write reference cell current, the cell is deemed to be programmed. Significantly and as will become more clear in later discussions, when a memory, read reference, or write reference cell is selected to be programmed or read, it is placed in saturation mode while remaining unselected cells are maintained in linear mode.

The threshold voltages are raised as the cells are programmed. The threshold voltage of an erased cell is approximately −2 V. Because the present invention is designed to be used on a semiconductor manufacturing process that does not support the generation or use of negative voltages, the logic state '00' is formed by a cell having a gate voltage of 0.0 V wherein its current is incrementally less than the current through the appropriate write reference cell. The preferred embodiment of the present invention uses 0.7 V as the gate voltage to represent the logic state '01', gate voltage 1.4 V to represent the logic state '10', and gate voltage 2.1 V to represent the logic state '11'. It should be obvious to one of ordinary skill in the art that other voltage levels can be similarly used.

Table 1 below provides approximate current levels corresponding to reference voltages for four level programming. For example, during reading of a cell that has been programmed with a logic state of '00', where there is 0.0 V placed on the gate of the cell, a maximum of 5 uA and a minimum of 4.5 uA will be drawn by the cell. Table 2 below provides similar current vs. reference voltage information for 16 level programming i.e. 4 bits.

TABLE 1

| Cell | Cell Current in µA for four Program Levels | | | | | | | |
|---|---|---|---|---|---|---|---|---|
| | 00 | | 01 | | 10 | | 11 | |
| Gate Voltage | Max I | Min I | Max I | Min I | Max I | Min I | Max I | Min I |
| 0.0 V | 5 | 4.5 | 0 | 0 | 0 | 0 | 0 | 0 |
| 0.7 V | 17 | 14.5 | 5 | 4.5 | 0 | 0 | 0 | 0 |
| 1.4 V | 33.2 | 27.8 | 17 | 14.5 | 5 | 4.5 | 0 | 0 |
| 2.1 V | 53 | 43.8 | 33.2 | 27.8 | 17 | 14.5 | 5 | 4.5 |

TABLE 2

Cell Current in µA for 16 Program Levels

Program Levels (precharge = 1.5 V)

| Cell Gate Voltage | 0000 | | 0001 | | 0010 | | 0011 | | 0100 | | 0101 | | 0110 | | 0111 | |
|---|---|---|---|---|---|---|---|---|---|---|---|---|---|---|---|---|
| | Max I | Min I | Max I | Min I | Max I | Min I | Max I | Min I | Max I | Min I | Max I | Min I | Max I | Min I | Max I | Min I |
| 0.00 V | 5 | 4.05 | 2.16 | 1.9 | 0.45 | 0.40 | 0 | 0 | 0 | 0 | 0 | 0 | 0 | 0 | 0 | 0 |
| 0.25 V | 8.6 | 6.8 | 5 | 4.05 | 2.16 | 1.9 | 0.45 | 0.40 | 0 | 0 | 0 | 0 | 0 | 0 | 0 | 0 |
| 0.5 V | 13 | 9.95 | 8.6 | 6.8 | 5 | 4.05 | 2.16 | 1.9 | 0.45 | 0.40 | 0 | 0 | 0 | 0 | 0 | 0 |
| 0.75 V | 18 | 13.6 | 13 | 9.95 | 8.6 | 6.8 | 5 | 4.05 | 2.16 | 1.9 | 0.45 | 0.40 | 0 | 0 | 0 | 0 |
| 1 V | 23.5 | 17.5 | 18 | 13.6 | 13 | 9.95 | 8.6 | 6.8 | 5 | 4.05 | 2.16 | 1.9 | 0.45 | 0.40 | 0 | 0 |
| 1.25 V | 29.5 | 21.7 | 23.5 | 17.5 | 18 | 13.6 | 13 | 9.95 | 8.6 | 6.8 | 5 | 4.05 | 2.16 | 1.9 | 0.45 | 0.40 |
| 1.5 V | 36 | 26.4 | 29.5 | 21.7 | 23.5 | 17.5 | 18 | 13.6 | 13 | 9.95 | 8.6 | 6.8 | 5 | 4.05 | 2.16 | 1.9 |
| 1.75 V | 42.7 | 31.3 | 36 | 26.4 | 29.5 | 21.7 | 23.5 | 17.5 | 18 | 13.6 | 13 | 9.95 | 8.6 | 6.8 | 5 | 4.05 |
| 2 V | 50 | 36.6 | 42.7 | 31.3 | 36 | 26.4 | 29.5 | 21.7 | 23.5 | 17.5 | 18 | 13.6 | 13 | 9.95 | 8.6 | 6.8 |
| 2.25 V | 57.6 | 42.1 | 50 | 36.6 | 42.7 | 31.3 | 36 | 26.4 | 29.5 | 21.7 | 23.5 | 17.5 | 18 | 13.6 | 13 | 9.95 |
| 2.5 V | 65.6 | 48 | 57.6 | 42.1 | 50 | 36.6 | 42.7 | 31.3 | 36 | 26.4 | 29.5 | 21.7 | 23.5 | 17.5 | 18 | 13.6 |
| 2.75 V | 74 | 54.2 | 65.6 | 48 | 57.6 | 42.1 | 50 | 36.6 | 42.7 | 31.3 | 36 | 26.4 | 29.5 | 21.7 | 23.5 | 17.5 |
| 3 V | 82.6 | 60.6 | 74 | 54.2 | 65.6 | 48 | 57.6 | 42.1 | 50 | 36.6 | 42.7 | 31.3 | 36 | 26.4 | 29.5 | 21.7 |
| 3.25 V | 91.7 | 67.4 | 82.6 | 60.6 | 74 | 54.2 | 65.6 | 48 | 57.6 | 42.1 | 50 | 36.6 | 42.7 | 31.3 | 36 | 26.4 |
| 3.5 V | 101.1 | 74.5 | 91.7 | 67.4 | 82.6 | 60.6 | 74 | 54.2 | 65.6 | 48 | 57.6 | 42.1 | 50 | 36.6 | 42.7 | 31.3 |
| 3.75 | 111 | 81.8 | 101.1 | 74.5 | 91.7 | 67.4 | 82.6 | 60.6 | 74 | 54.2 | 65.6 | 48 | 57.6 | 42.1 | 50 | 36.6 |

| Cell Gate Voltage | 1000 | | 1001 | | 1010 | | 1011 | | 1100 | | 1101 | | 1110 | | 1111 | |
|---|---|---|---|---|---|---|---|---|---|---|---|---|---|---|---|---|
| | Max I | Min I | Max I | Min I | Max I | Min I | Max I | Min I | Max I | Min I | Max I | Min I | Max I | Min I | Max I | Min I |
| 0.00 V | 0 | 0 | 0 | 0 | 0 | 0 | 0 | 0 | 0 | 0 | 0 | 0 | 0 | 0 | 0 | 0 |
| 0.25 V | 0 | 0 | 0 | 0 | 0 | 0 | 0 | 0 | 0 | 0 | 0 | 0 | 0 | 0 | 0 | 0 |
| 0.5 V | 0 | 0 | 0 | 0 | 0 | 0 | 0 | 0 | 0 | 0 | 0 | 0 | 0 | 0 | 0 | 0 |
| 0.75 V | 0 | 0 | 0 | 0 | 0 | 0 | 0 | 0 | 0 | 0 | 0 | 0 | 0 | 0 | 0 | 0 |
| 1 V | 0 | 0 | 0 | 0 | 0 | 0 | 0 | 0 | 0 | 0 | 0 | 0 | 0 | 0 | 0 | 0 |
| 1.25 V | 0 | 0 | 0 | 0 | 0 | 0 | 0 | 0 | 0 | 0 | 0 | 0 | 0 | 0 | 0 | 0 |
| 1.5 V | 0.45 | 0.40 | 0 | 0 | 0 | 0 | 0 | 0 | 0 | 0 | 0 | 0 | 0 | 0 | 0 | 0 |
| 1.75 V | 2.16 | 1.9 | 0.45 | 0.40 | 0 | 0 | 0 | 0 | 0 | 0 | 0 | 0 | 0 | 0 | 0 | 0 |
| 2 V | 5 | 4.05 | 2.16 | 1.9 | 0.45 | 0.40 | 0 | 0 | 0 | 0 | 0 | 0 | 0 | 0 | 0 | 0 |
| 2.25 V | 8.6 | 6.8 | 5 | 4.05 | 2.16 | 1.9 | 0.45 | 0.40 | 0 | 0 | 0 | 0 | 0 | 0 | 0 | 0 |
| 2.5 V | 13 | 9.95 | 8.6 | 6.8 | 5 | 4.05 | 2.16 | 1.9 | 0.45 | 0.40 | 0 | 0 | 0 | 0 | 0 | 0 |
| 2.75 V | 18 | 13.6 | 13 | 9.95 | 8.6 | 6.8 | 5 | 4.05 | 2.16 | 1.9 | 0.45 | 0.40 | 0 | 0 | 0 | 0 |
| 3 V | 23.5 | 17.5 | 18 | 13.6 | 13 | 9.95 | 8.6 | 6.8 | 5 | 4.05 | 2.16 | 1.9 | 0.45 | 0.40 | 0 | 0 |
| 3.25 V | 29.5 | 21.7 | 23.5 | 17.5 | 18 | 13.6 | 13 | 9.95 | 8.6 | 6.8 | 5 | 4.05 | 2.16 | 1.9 | | |
| 3.75 | 42.7 | 31.3 | 36 | 26.4 | 29.5 | 21.7 | 23.5 | 17.5 | 18 | 13.6 | 13 | 9.95 | 8.6 | 6.8 | 5 | 4.05 |

The unique gate voltages, in the case of 2-bits being 4 unique voltages, can be generated on chip using any conventional circuit. In the preferred embodiment, an internal bandgap voltage generator provides 2.1 V and three equivalent series resistors connected between 2.1 V and 0.0 V generate the remaining voltages. Naturally, the four gate voltages could be provided externally to the memory device chip.

FIG. 2 shows the construction for a memory block, read reference block, or write reference block each block having four columns with 16 EEPROM cells in each column. Select Line 1 200 activates a plurality of select transistors 202A–D. A bit line is coupled to the drains of the select transistors 202 to activate only one column of transistors. A plurality of transistor cells 210 are coupled with their respective channels in series to each of the select transistors. In the preferred embodiment, there are sixteen cells in each column making a 16-row, 4-column block. A second select line 204 is also provided for activating a second plurality of select transistors 206A–D. One of each of the select transistors 206 is coupled to each of the columns and a common source line 208.

The gates of each of the select transistors 202 in each column are connected together. The transistor cells in a row have common gates.

The NAND architecture of the present invention uses 16 transistors in series within each block. In prior art designs, as discussed earlier, this introduces the problem of the current detected by the sense amplifier when reading one cell to be influenced by the threshold voltages of the other 15 cells within the group. For instance, in an extreme case it will be very difficult to differentiate the current level detected by a cell having one threshold with all 15 transistors in its group having the highest allowed threshold levels versus the current detected by a cell having one step higher threshold with all 15 transistors in its group having the lowest allowed threshold levels.

The operation of the circuit in FIG. 1 can be described by the four functions described below: Programming of read reference blocks 112X, programming of write reference blocks 112Y, programming of memory blocks 112(A,A)–(M,N), and finally reading the memory blocks. It is assumed that the block erase operation is the same as prior art. It should be noted that memory blocks 112(A, A)–112(M,N) are erased separately from the read and write reference blocks. In fact, when data blocks are erased during normal operation, read and write reference blocks do not get erased. As mentioned above, programming of read reference blocks 112X and write reference blocks 112Y are performed only once during product test and setup after erase. Indeed, it is an important aspect of the invention that read and write reference blocks 112X and 112Y respectively, remain as initially programmed until it becomes necessary to re-initiate system set up. This is because, read and write reference block cells need to track the memory array block cells under all temperature and power supply variations.

1. Programming Write Reference Blocks

First, the cells in write reference block 112Y are erased with each cell threshold set to approximately −2 V. In FIG. 1, SW2 136 is set to position 1 selecting Iref2 as input to sense amplifier 126. Address decode 110 is set to select the first row of cells for programming.

The 2-bit counter is set to logic state '00'. The 2-bit bus 122 selects the first column of the write reference block 112Y cells and provides 0.0 V on the output of the Prog./Read Voltage Generator 130 as well as on the selected row during program verify time.

Figure 4:
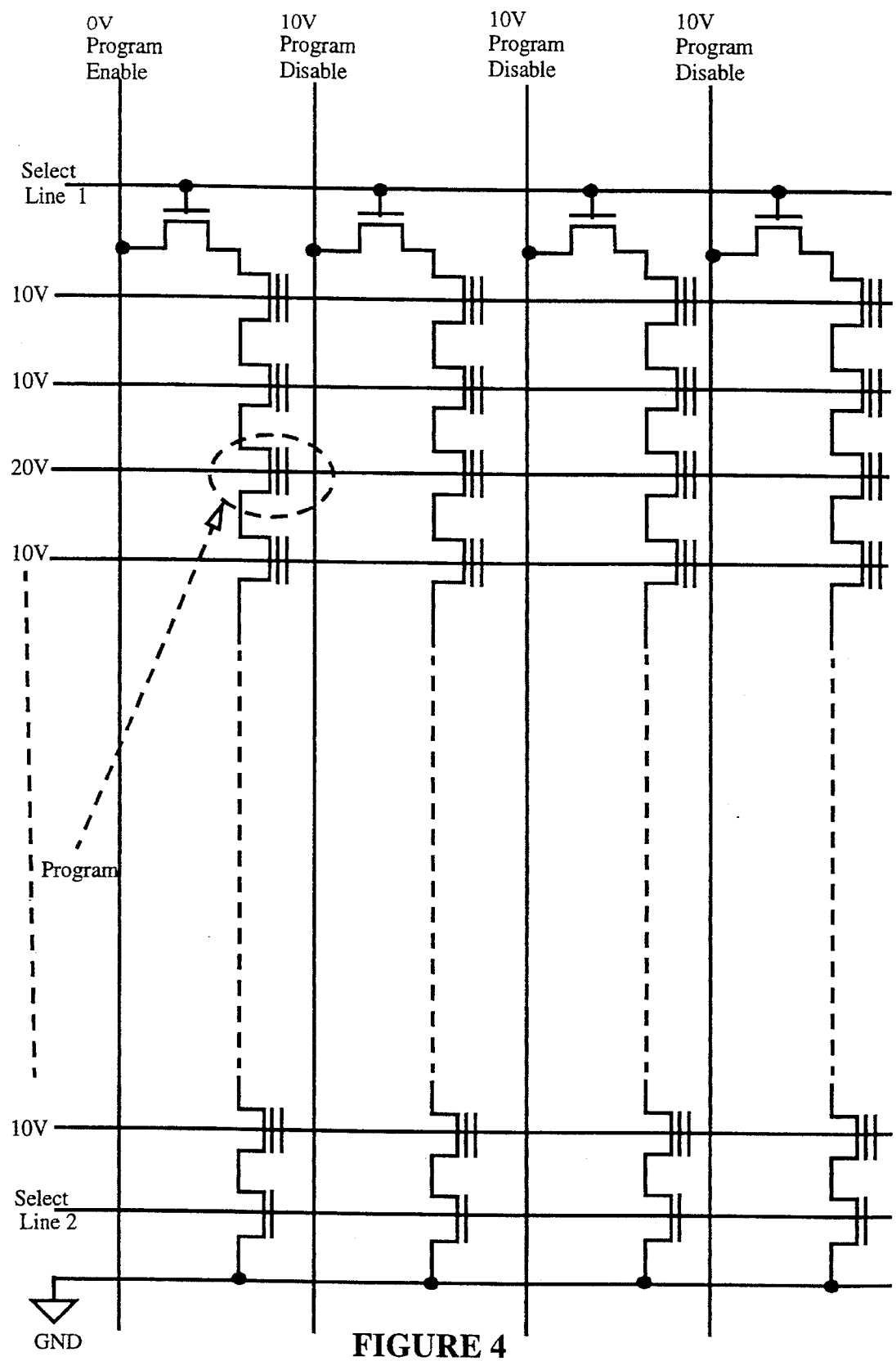
FIG. 4 shows a typical memory block during program operation.

In what will be referred to as a programming step, proper voltages are applied to the cells in the write reference block 112Y as shown in FIG. 4 for a short time to program the cell selected by the column and row addresses as selected by address decode 110 in conjunction with column select 108Y. All other columns are disabled. Subsequently, in what will be referred to as a verify step, proper voltages are applied to the write reference cells according to FIG. 6 to read the current through the programmed cell. The Verify Write Reference Cells signal is activated and the current through the selected cell is compared to Iref2 (~2.5 uA or ½ of Iref1 in the preferred embodiment).

Figure 7:
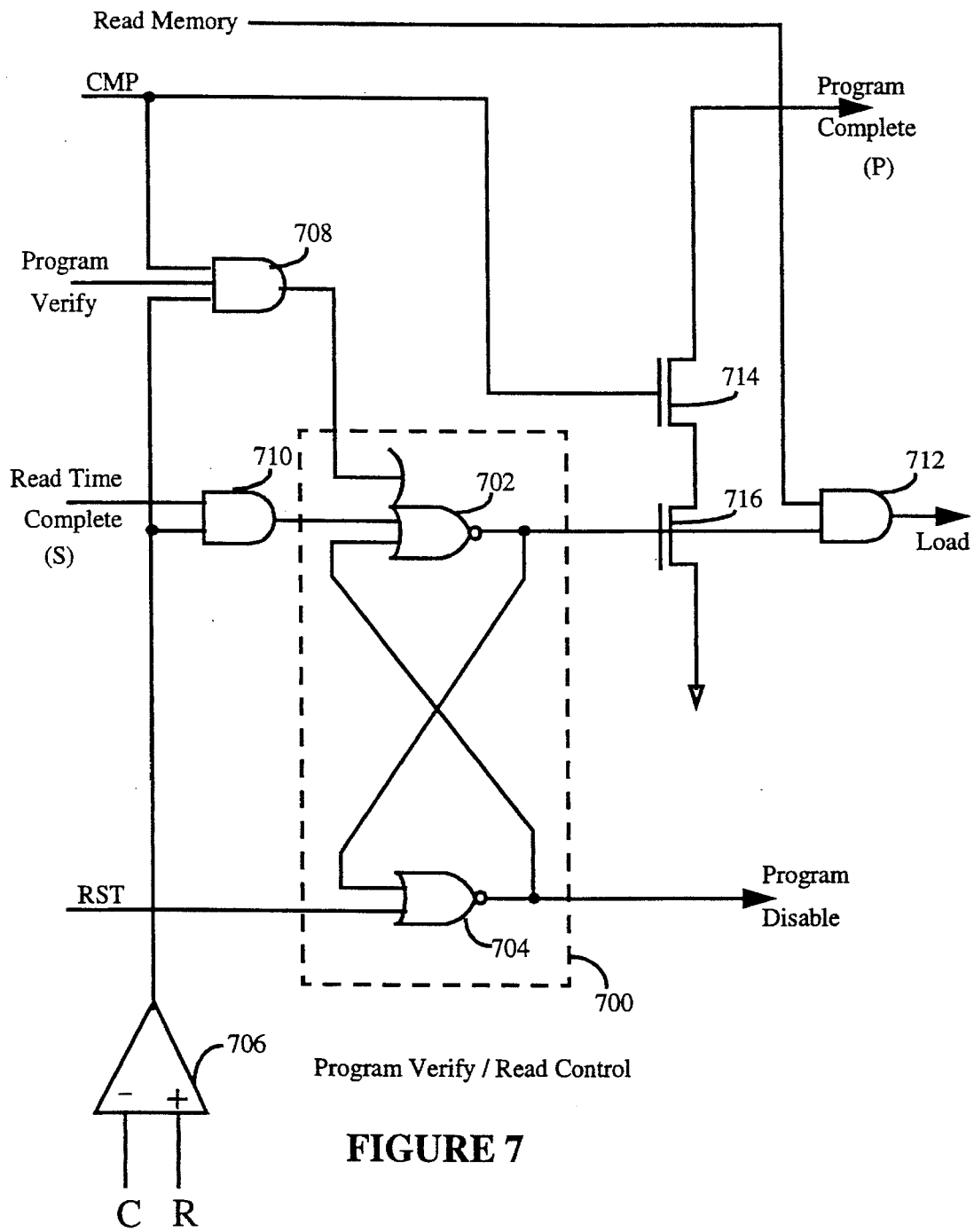
FIG. 7 shows the detailed diagram of the Program/Verify/Read block of FIG. 1.

It should be noted that Iref2 is carefully chosen to be less than Iref1 yet not too small to allow cross over of one voltage threshold level to another. In the preferred embodiment, Iref2 is chosen to provide 2.5 uA of current whereas Iref1 is chosen to provide 5 uA of current; this current margin allows more accurate reading of the memory cells despite cell current variations and further allows gauging the time required to read a memory cell using a corresponding write reference cell for such time gauging. Accordingly, the memory cells are programmed against write reference cells at a current level of 2.5 uA while read against read reference cells at a current level of 5 uA. To reiterate, where a memory cell is programmed relative to a current that is less than the reference current used to read the same cell, it is less likely that a stored value will be read inaccurately. Additionally, having programmed the memory cells relative to the write reference cell current level will result in the memory cell current being slightly less than the write reference cells and since the write reference cells are themselves programmed to a lower current level than the read reference cells, the time required to read a memory cell will be guaranteed to be less than the time required to read a corresponding write reference cells. Using the write reference cells to gauge the time required to read memory cells, ensures enough time to do the read. It will require less time to read a memory cell because it has been programmed to less than 2.5 uA while the corresponding write reference cell is programmed to 2.5 uA. This is shown in FIG. 7 where during memory read operation, Read Time Complete signal also referred to as input signal (S) will be high when the corresponding write reference cell has been read, this will set the output of AND gate 710 because the other input of the same AND gate is set by the completion of reading the memory cell i.e. the output of sense amplifier 706.

Another alternative would be to provide only one set of reference cells rather than both read and write references wherein during both program verification and reading, memory cells are compared to only one set of corresponding reference cells. In this case, the adjustment is made in the sense amplifier to provide margin. However, it is anticipated that this alternative will result in a decrease in memory cell tracking variations.

After the first program step, the cell current is much higher than Iref2 and as the programming steps are repeated, the cell current decreases. When the cell current is slightly less than Iref2 causing the output of the sense amplifier 126 and the 2-input AND 128 to go high, programming of the selected write reference cell is completed.

Next, the 2-bit counter 132 is incremented to logic state '01'. The 2-bit bus 122 selects the second column of the write reference block 112Y cells and additionally provides 0.7 V on the output of Prog./Read Voltage Generator block 130 as well as to the selected row during program verify time. Program and verify steps are carried out similarly to when the counter 132 was in logic state '00' as described above until the cell is programmed for logic state '01' corresponding to 0.7 V.

In the same manner as above, counter 132 is incremented to logic state '10' and program and verify is again performed similarly to the description above except the 2-bit bus 122 selects the third column of the write reference cells and selects 1.4 V on the output of block 130 and to the selected row during program verify time. The same is done for logic state '11' where the fourth column of the write reference cells is selected and 2.1 V is provided by block 130 to the selected row. This completes programming of the first row of write reference block 112Y cells.

Next, the address decode 110 is set to select the second row of the block and programming is then performed in the same manner as for the first row of the block. The address decode 110 is then set to select the third row and programming of that row resumes as discussed above, followed by programming of the fourth row, the fifth row and so on until all remaining cells in the write reference block 112Y are programmed. Although one write reference block can be used for all of the memory cells, in the preferred embodiment, multiple write reference blocks repeated throughout the array to improve accuracy and tracking.

Where there is more than one block of write reference blocks as shown in FIG. 1, upon completion of the first write reference block such as 112YA, the remaining write reference blocks are programmed in the same manner until all of reference blocks 112YA–M are programmed.

Once programmed, the write reference cells are never erased during system operation and are used as a reference level to write data to the storage cells of the memory block array 112(A,A)–112(M,N) as will be discussed later.

2. Programming Read Reference Blocks

Programming of the read reference blocks 112X is very similar to programming write reference blocks 112Y as discussed above. Address decoder 110 is set to select the first row of cells to be programmed. Counter 132 is initially set to the value '00' thereby selecting the first column. The counter output '00' also selects the voltage level through voltage generator 130 which value represents 0.0 V and is applied to the selected row of the read reference block. To prevent programming of the unselected cells, the remaining bit lines and word lines in FIG. 2 are connected to 10 V.

Figure 6:
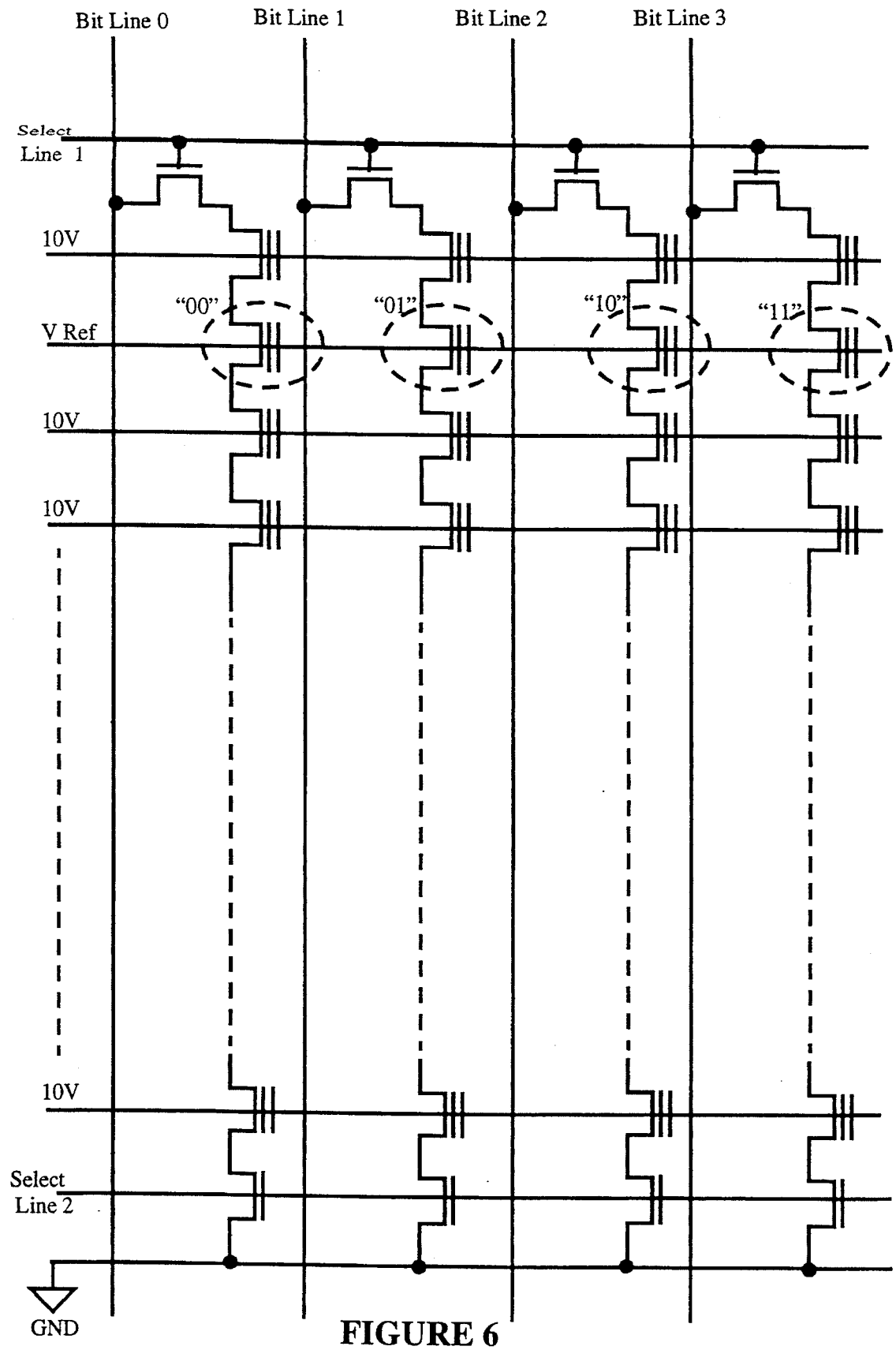
FIG. 6 shows the present invention read operation of a typical memory block.

Programming pulses are applied to the selected read reference cell according to FIG. 4 for a short time followed by application of proper voltages according to FIG. 6 to read the current through the programmed cell. The Verify Read Reference Cells signal is activated and the current through the cell is compared to Iref1 (~5 uA). Initially the cell current is much higher than Iref1. As programming steps are repeated, the cell current decreases until it is slightly less than Iref1 thereby causing the sense amplifier 114 to go high and the 2-input AND 118 to indicate the reference cell program for this level is completed.

Next, the 2-bit counter 132 is set to logic state '01' and the 2-bit bus 122 selects the second column of the read reference block 112X cells therein 0.7 V is provided on the output of voltage generator 130 and to the selected row during program verify. Program and verify steps are carried out as discussed above until the desired level is reached. Counter 132 is subsequently incremented to state '10' where the third column is programmed using 1.4 V followed by programming of the fourth column cell using 2.1 V.

Once the programming of one row of read reference cells is completed, the next row of cells are programmed in the same way with counter 132 starting from logic state '00' to progressing to state '11'. Where there is more than one block of read reference blocks as shown in FIG. 1, upon completion of the first read reference block such as 112XA, the remaining read reference blocks are programmed in the same manner until all of the reference blocks 112XA–M are programmed.

Once programmed, the read reference cells are never erased during system operation and are used as a reference level to read data from the storage cells of the memory block array 112(A,A)–112(M,N) as will be discussed later.

3. Programming of the Memory Array Blocks

To begin, once a memory cell has been programmed, it must first be erased prior to re-programming of the same cell. During programming, after the write reference cells have been programmed they are used as a reference to program data into the storage cells of the memory block array 112. In the preferred embodiment, an entire page of data is loaded sequentially into registers 102 from I/O bus 100. Under control of the PVR 106, the data in the I/O registers is programmed into the cells selected by the column select circuits 108 and the address decoder 110 in the following manner.

Data to be programmed is loaded in registers 102 by activating the Write Data in0-K signals sequentially. The address decode block 110 selects the row and columns to be programmed. SW1 120 is set to position 1 to select the write reference cells as input to PVR blocks 106.

RST signal is activated to reset all of the program disable latches 700 of FIG. 7. This will allow the cells in a page (a page being one row across all memory blocks 112A through 112N and one column from each memory block 112(A,A) through 112(M,N)) to be programmed regardless of their final program level.

The 2-bit counter is set to '00' and the 2-bit bus 122 selects the first column of read and write reference cells and provides 0.0 V on the output of block 130 and to the selected row during program verify time.

Figure 8:
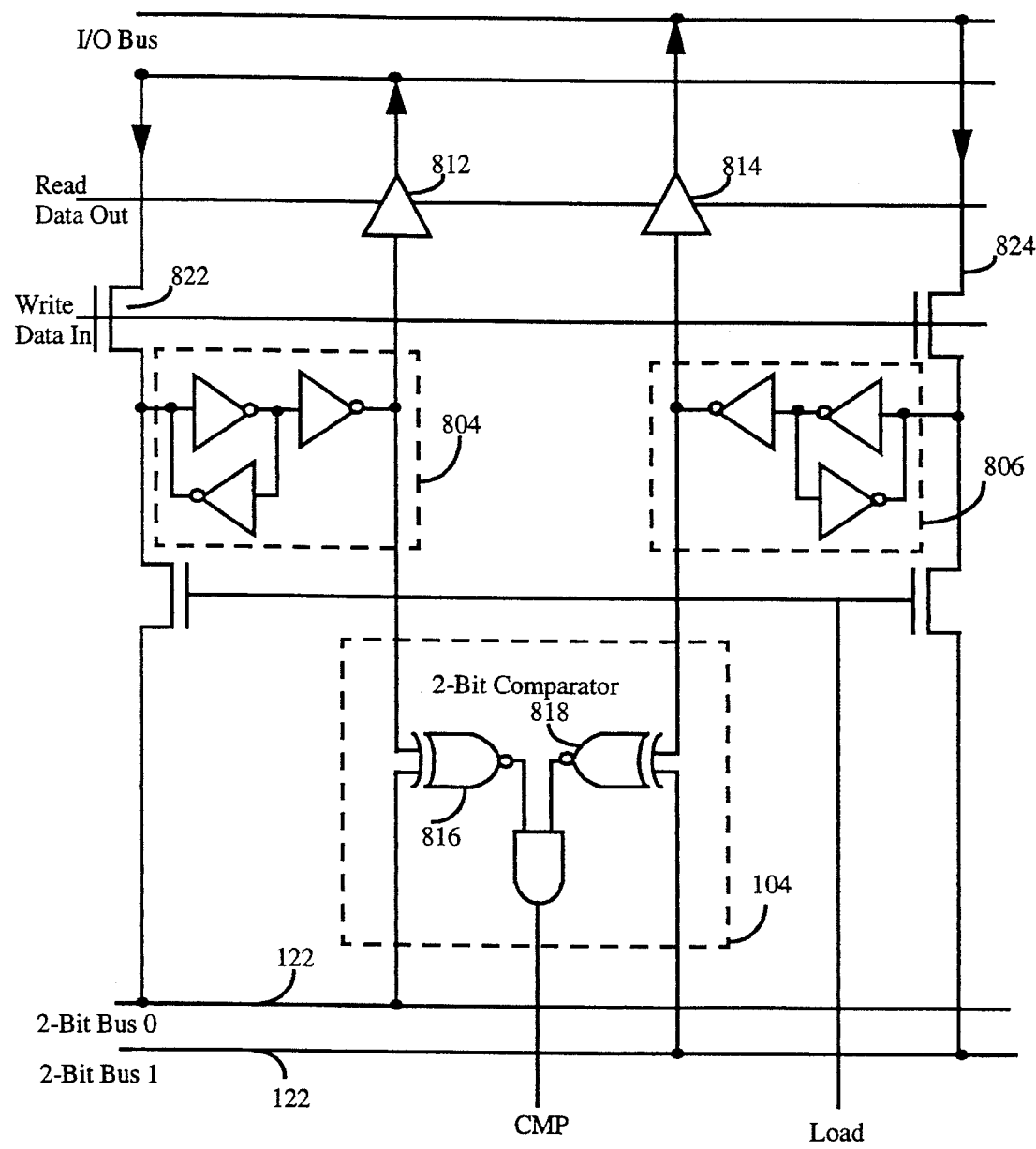
FIG. 8 shows a more detailed diagram of the 2-bit register and 2-bit comparator block of FIG. 1.

FIG. 8 is a detailed drawing of the circuit within a 2-bit I/O Register 102 and comparator 104, associated I/O bus, drivers 812, 814, and 2-bit bus 122. FIG. 7 is a detailed circuit of a PVR block 106. During a memory program operation, an entire page of data is stored in the 2-bit I/O registers 102.

In FIG. 8, the Write Data In signal is enabled thereby allowing the value appearing on the I/O Bus to be latched into the latch circuits 804 and 806. The outputs of latch circuits 804 and 806 are provided as inputs to comparator 104. If the latched value matches the value provided by counter 132 on the 2-bit bus 122, then the CMP signal, provided as an input to the PVR circuit of FIG. 7, is high. All of the 2-bit comparators 104A through 104N compare the contents of their corresponding 2-bit I/O register to the '00' on the 2-bit bus. The CMP output of all of the comparators with '00' in their 2-bit I/O registers will go high. This will enable their corresponding 3-input AND 708 of FIG. 7, and also pull low the program complete (P). If none of the 2-bit registers 102 contain '00', then (P) will be high and this programming level is skipped. During programming of the memory blocks 112, SW1 in FIG. 1 is set to position 1 so that the R input to the sense amplifier 706 in FIG. 7 receives the current from a corresponding write reference cell. Sense amplifier 706 compares the current on its input C representing the selected memory block cell's current provided by column select 108A to the current on input R.

Proper voltages are applied to the row and columns according to FIG. 4 for a short time to program the selected cells (this will be referred to as the programming step). All other columns are disabled. Proper voltages are applied to the row and columns according to FIG. 6 to read the current through the just programmed cells (this will be referred to as the verify step).

Next, the Program.Verify signal of FIG. 7 is activated and sense amplifier 706 of FIG. 7 compares the cell current to the corresponding current from the selected write reference cell in the corresponding block of 112Y. Initially the cell current is much higher than the reference current. After repeating the programming and verification steps, the current through some of the cells will become slightly smaller than the write reference current. For these cells, if their corresponding CMP is high, the output of the sense amplifier 706 and 3-input AND 708 will go high setting the latch 700 and forcing the 3-input NOR 702 low, disabling the pull-down (P) and forcing the Program Disable signal high which is the output of the 2-input NOR 704. This applies proper voltage on the corresponding column lines (10 V in the preferred embodiment) and disables the cells from being programmed any further.

Programming and verification thereof is continued in the above manner until all of the cells with their CMP high are programmed and the Program Complete signal (P) goes high. This completes the programming of the '00' level.

Subsequently, 2-bit counter 132 is incremented to logic state '01' wherein the 2-bit bus 122 selects the second column of read and write reference cells and provides 0.7 V on the output of block 130 and to the selected row during program verify time. All of the 2-bit comparators 104A through 104N compare the contents of their corresponding 2-bit I/O register to the '01' logic state on the 2-bit bus 122. The CMP output of all of the comparators with logic state '01' in their 2-bit I/O registers will go high. This will enable their corresponding 3-input AND 708 of FIG. 7, and pull low the Program Complete signal (P).

All of the cells within this page have already been programmed to near '00' level after previous programming step. Program and verification steps are repeated until all of the cells whose 2-bit register contains '01' have been programmed and their corresponding columns have been disabled.

Next, the 2-bit counter 132 is incremented to '10'. The 2-bit bus 122 now selects the third column of the read and write reference cells and selects 1.4 V to be applied to the output of the block 130 and to the selected row during program verify time. All of the 2-bit comparators 104A through 104N compare the contents of their corresponding 2-bit I/O register 102 to logic state '10' on the 2-bit bus 122. The CMP output of all of the comparators with '10' in their corresponding 2-bit I/O registers will go high. This will enable corresponding 3-input AND gates 708 in FIG. 7 and will pull low the Program Complete (P) signal. All of the remaining cells within this page have been previously programmed to near '01' logic state. Accordingly, program and verify steps are repeated until all the cells with their corresponding 2-bit I/O register 102 being '10' are programmed and their corresponding columns have been disabled.

The 2-bit counter 132 is then incremented to '11' wherein the 2-bit bus 122 selects the fourth column of read and write reference cells and also provides 2.1 V on the output of block 130 and to the selected row during program verify time. All of the 2-bit comparators 104A through 104N compare the contents of their corresponding 2-bit I/O register to the '11' on the 2-bit bus. The CMP output of all of the comparators with '11' in their corresponding 2-bit I/O registers will go high. This will enable their corresponding 3-intput AND 708 in FIG. 7, and pull low the Program Complete (P).

All of the remaining cells within this page have been programmed to near '10' level. Thus, program and verify steps are repeated until all of the cells with '11' in their 2-bit registers have been programmed and their corresponding column have been disabled. At this point, all four levels have been programmed into one page of memory. The same steps as discussed above are repeated to program additional pages.

4. Reading the Memory Array Blocks

Switches SW1 120 and SW2 136 are set to position 2 to select the read and write reference blocks 112. RST signal is activated to reset all of the program disable latches 700 in FIG. 7. During read memory operations, these latches are used to disable the loading of the I/O registers after the desired level has been detected and stored in them. Note that the 3-input NOR gate 702 is high thereby enabling the 2-input AND 712.

Next, row and column addresses are applied to address decode 110 to select the desired page of memory to be read. It is significant to note that while programming of the memory cells started with logic state '00', reading of the memory cells starts with logic state '11'. The 2-bit counter is set to '11' and the 2-bit bus selects the fourth column of read and write reference cells and provides 2.1 V on the output of block 130 and to the selected row during memory read.

The Read Memory signal is thereafter activated causing the Load signal to go high and to load the I/O registers 102 with the value appearing on the 2-bit bus 122. All the I/O registers are loaded with '11'.

The current through all of the selected cells are compared with the corresponding read reference cell by sense amplifier 706 in FIG. 7. Sense amplifier 126 compares the selected read reference and write reference cells for timing. When reading of the write and read reference cells is completed, the output of the 2-input AND gate 116 goes high and activates Read Time Complete signal (S). At this time, sense amplifier 706 of all of the cells which have been previously programmed to '11' will go high causing the output of the 2-input AND 710 gate to go high. This will set the latch 700 disabling the Load signal. All other latches having corresponding cells programmed to other than a '11' value will have their Load signal active.

Subsequently, the 2-bit counter 132 is decremented to '10' to allow reading of cells programmed under voltage level 1.4 V. The 2-bit bus 122 selects the third column of read and write reference cells and provides 1.4 V on the output of block 130 and to the selected row during memory read time.

The Read Memory signal is again activated causing the Load signal to go high and loading the I/O registers 102 of those registers whose Load signal has not been disabled from the 2-bit bus 22. These I/O registers are loaded with '10'. The current through all of the selected cells are compared to the read reference cell by sense amplifier 706. Sense amplifier 126 compares the selected read reference and write reference cells for timing and after sensing time the 2-input AND gate 116 goes high. This activates Read Time Complete (S). At this time, sense amplifier 706 of all of the cells which have been previously programmed to '10' will go high causing the 2-input AND 710 to go high thereby setting latch 700 disabling the Load signal. It should be noted that all other latches with corresponding cells not programmed to '11' or '10' will have their Load signal active.

Next the 2-bit counter 132 is decremented to the state '01' and the 2-bit bus 122 selects the second column of read and write reference cells and provides 0.7 V on the output of block 130 and to the selected row during memory read time. Read Memory signal is activated thereby causing the Load signal to go high and loading the I/O registers 102 for those registers whose Load signal has not been disabled from the 2-bit bus. These I/O registers are now loaded with '01'.

The current through all of the selected cells are compared to the read reference cell by sense amplifier 706. Sense amplifier 126 compares the current through the selected read reference and write reference cells for timing and after sensing time, the 2-input AND gate 116 goes high. This activates Read Time Complete (S). At this time, comparator 706 of all of the cells which have been previously programmed to '01' will go high causing the 2-input AND 710 to go high thereby setting latch 700 and causing the 3-input NOR gate 702 to go low thus disabling the Load signal. It should be noted that all other latches with corresponding cells not programmed to '11' or '10' or '01' will have their Load signal active.

The 2-bit counter 132 is decremented to state '00' and the 2-bit bus 122 selects the first column of read and write reference cells and provides 0.0 V on the output of voltage generator 130 and to the selected row during memory read time. The Read Memory signal is activated thereby causing the Load signal to go high and loading the I/O registers of those register whose Load signal has not been disabled from the 2-bit bus 122. These I/O registers are loaded with '00'.

The current through every selected cell is compared to the read reference cell by sense amplifier 706. Sense amplifier 126 compares the current through the selected read reference and write reference cells for timing and after sensing is done, the output of the 2-input AND gate 116 goes high. This activates Read Time Complete (S). At this time, sense amplifier 706 of all of the cells which have been previously programmed to '00' will go high causing the 2-input AND 710 to go high thereby setting latch 700 disabling the Load signal.

Thus, loading of all of the I/O registers 102 is completed from their respective memory cells and the Read Dataout signal for different groups of I/O registers can now be activated to allow transferring of data to the I/O bus 100.

During the read of each page, SW2 is toggled to position 2 wherein the current through a corresponding read reference block is provided through column select 108X to one of the two inputs of sense amplifier 126. The other input of sense amplifier 126 is the corresponding write reference cell. The output of sense amplifier 126 which goes high when the read reference and write reference cell comparison is completed, provides the S input to the PVR block 106. The S input which is effectively the result of a comparison of the current drawn by the write reference cell and the read reference cell gauges the maximum time required for reading a corresponding memory cell. In other words, once the S input to the PVR block is high, it is presumed that the read operation is also completed and the result will set latch 700.

It is an important aspect of the invention that programming and verification of the memory array blocks against the read and write reference cells eliminates the need for digital to analog and analog to digital converters. It also improves power supply and temperature tracking in case the device is programmed under one set of conditions and read under a different set of conditions.

Figure 3:
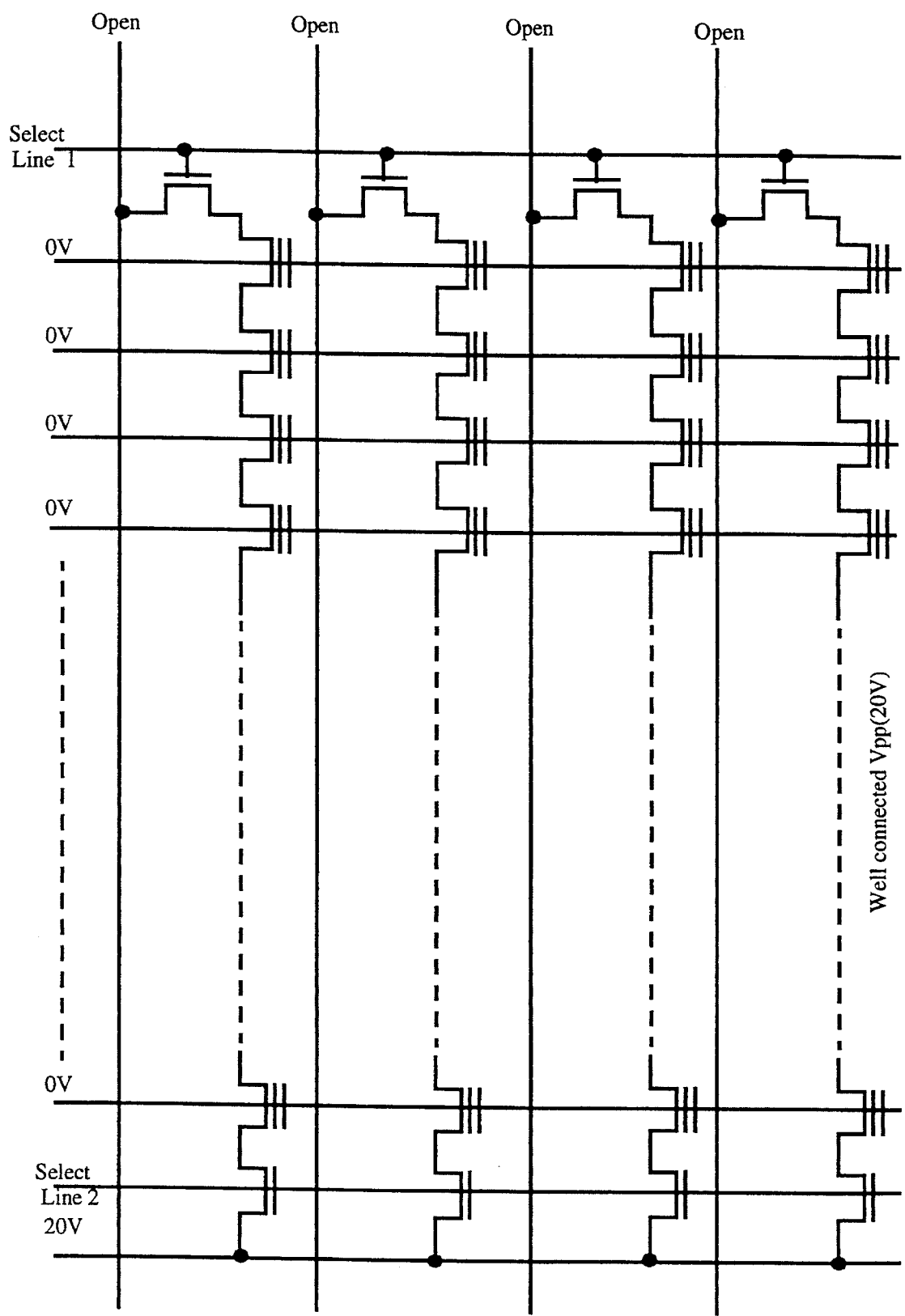
FIG. 3 shows a typical memory block during erase operation.

FIG. 3 shows the power connections to the array during an erase step. 0.0 V is coupled to the gates of all the transistor cells. 20 V is coupled to the source line 208 and to the well. The bit lines are open. The block select lines are activated.

FIG. 4 shows the power connections to the array during a programming operation. The cell to be programmed is shown encircled in a broken oval. The gate voltage for all the cells in the row being programmed is 20 V. The gate voltages for all other rows of cells are at 10 V. The bit line for the cell being programmed is 0 V. All other bit lines are at 10 V. The source line is coupled to ground which in the preferred embodiment is 0.0 V. The block select lines are activated during program time.

Figure 5:
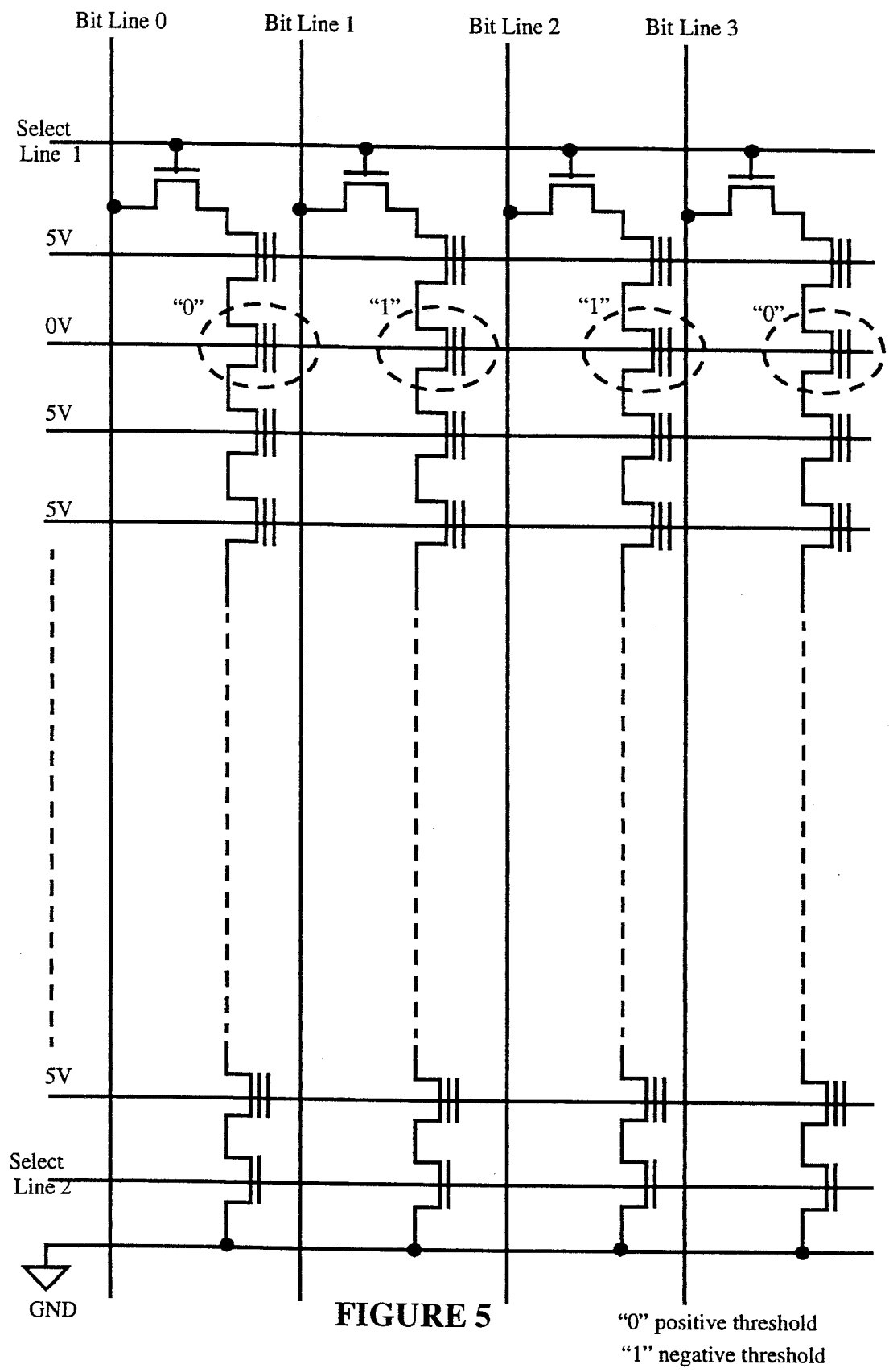
FIG. 5 shows the prior art read operation of a typical memory block.

FIG. 5 shows the power connections to the array during a read of a prior art nonvolatile 2-level memory array. All the cells have a gate voltage of 5 V except the cells being read which have 0 V gate voltage. The source line is coupled to ground. The block select lines are activated.

FIG. 6 shows the power connections to the array during a read of the array of the present invention. The gate voltage for all the cells not being read is set to 10 V. This provides a very low impedance attributable to such cells and reduces the negative impact of voltage losses due to the series memory cells. The gate voltage of the cells being read is set to one of the four predetermined gate voltage levels. The source line is coupled to ground. The block select lines are activated.

In the more detailed block diagram of the PVR blocks of 106 of FIG. 7, latch 700 includes a reset RST input. Before either a program or a read operation, the RST signal is applied to reset the latch 700. Once the latch 700 is set during either a read or program operation, it will remain set until a RST signal is applied at the start of a subsequent read or program operation.

The present invention has been disclosed with regard to a preferred embodiment. Improvements, modifications and alternatives that become apparent to those of ordinary skill in the art only after reading this specification are deemed within the spirit and scope of this invention.

What is claimed is:

1. A memory array of multi-level non-volatile single transistor cells, wherein each cell is configured to store more that a single data bit, the array comprising:

a plurality of groups, each group comprising a plurality of memory cells, each memory cell having a control gate, a floating gate and a channel formed between a source and a drain, wherein the memory cells for each of the groups are coupled with their respective channels in series;

a plurality of select transistors, wherein two of the select transistors are coupled for selecting each group;

a programming circuit for selectively programming each of the memory cells to a predetermined current level in accordance with one of N gate voltages by storing a predetermined charge onto each of the respective floating gates wherein each of the N threshold voltages is representative of a predetermined collection of data bits:

a plurality of N write reference cells, N write reference cells for each memory cell in a group, each of the N write reference cells corresponding to the N predetermined reference voltages; and a circuit for sequentially comparing a current through one of the memory cells to a current through each of the appropriate N write reference cells for storing a collection of data bits.

2. The memory array according to claim 1 further comprising:
   (a) a plurality of N read reference cells, N read reference cells for each memory cell in a group, each of the N read reference cells corresponding to the N predetermined reference voltages; and
   (b) a circuit for sequentially comparing a current through one of the memory cells to a current through each of the appropriate N read reference cells for determining a stored collection of data bits.

3. The memory array according to claim 1 wherein said circuit for sequentially comparing is further coupled to logic for disabling further programming of memory cells being programmed upon completion of programming of the same.

4. The memory array according to claim 2 further comprising a comparator having a first input coupled to said N read reference cells through a read column select logic and a second input for providing a predetermined read current reference during programming of said read reference cells.

5. The memory array according to claim 4 wherein said comparator is comprised of a sense amplifier.

6. The memory array according to claim 1 further comprising a comparator having a first input coupled to said N write reference cells through a write column select logic and a second input selectively coupled to either receive a predetermined write current reference during programming of said write reference cells or one of said N read reference cells during reading of said memory cells.

7. The memory array according to claim 6 wherein said comparator is comprised of a sense amplifier.

8. The memory array according to claim 1 further comprising address decode having row select logic coupled to said memory cells, read reference cells and write reference cells and further having column select logic coupled to said memory cells for selecting a memory cell for programming or reading wherein the selected cell is kept in saturation mode during reading of the same while remaining cells are maintained in linear mode.

9. The memory array according to claim 8 further comprising comparator circuitry having a first input coupled to said memory cells for receiving the current through a selected memory cell and a second input selectively coupled to receive the current through either one of said corresponding N read reference cells during a memory read operation or the current through one of said corresponding N write reference cells during a memory write operation.

10. The memory array according to claim 8 further comprising a counter coupled to said read and write column select logics for sequentially providing N logic states, each state representing one of said N reference voltages wherein said counter starts counting from logic state O and increments through to logic state N during programming of each of said memory, read and write reference cells and starts from logic state N and decrements through to logic state O during reading of the same.

11. The memory array according to claim 10 further comprising means coupled to an I/O bus for comparing during a memory, read reference, and write reference program operations a binary value to be programmed into a selected memory cell to the logic state provided by said counter and upon successful comparison thereof providing an output for disabling further programming of said selected memory cell.

12. The memory array according to claim 11 further comprising a storage device coupled between said I/O bus and said counter.

13. A method of programming a memory array of multi-level non-volatile single transistor cells, wherein each cell is configured to store more than a single data bit, the method comprising the steps of:
   providing a plurality of groups, each group comprising a select transistor and a plurality of memory cells, each memory cell having a control gate, a floating gate and a channel formed between a source and a drain, wherein the memory cells for each of the groups are coupled with their respective channels in series;
   selectively programming each of the memory cells to a predetermined current level by applying one of N gate voltages by storing a predetermined charge onto each of the respective floating gates wherein each of the N threshold voltages is representative of a predetermined collection of data bits;
   reading the memory tells by sequentially comparing a current through the memory cells to a current through one each of said N read reference cell for determining a stored collection of data bits; and
   gauging reading time of the memory cells by reading one each of N corresponding write and read reference cells simultaneously with said reading of a corresponding memory cell thereby providing sufficient memory cell reading time.

14. The method according to claim 13 further comprising the step of programming each of said N read reference cells to a predetermined reference current level during system initialization.

15. The method according to claim 14 further comprising the step of programming each of said N write reference cells to a predetermined reference current level being lower than the read reference current level during system initialization.

16. The method according to claim 13 further comprising the step of maintaining transistors of the selected memory cells during said programming step 5(b) in saturation mode while maintaining transistors of remaining unselected memory cells of the plurality of groups of cells in linear mode.

17. The method according to claim 13 further comprising the step of programming the memory cells by sequentially comparing a current through one of the memory cells to a current through one of corresponding N write reference cell for writing a stored collection of data bits to the memory cells.

18. The method according to claim 1 wherein during said memory cell programming step, applying 4 reference voltages (N=4), each reference voltage representative of data bits '00', '01', '10', and '11' respectively by first applying one of the reference voltages representative of data bits '00' to all of the memory cells being programmed, then applying the reference voltage representative of data bits '01' to all memory cells except the ones already programmed, further applying the reference voltage representative of data bits '10' to all memory cells except the ones already programmed, finally applying the reference voltage representative of data bits '11' to those memory cells selected to be programmed to logic state '11'.

19. The method according to claim 17 further comprising the step of after completion of programming of a selected cell to the reference voltage representative of the desired data bit state, disabling further programming of the same until after said plurality of groups of cells have been erased.

20. A multi-level non-volatile memory system comprising:
   (a) a memory array comprised of a plurality of memory blocks;
   (b) a plurality of read reference blocks;

(c) a plurality of write reference blocks; and (d) a circuit utilizing said read and write reference blocks to program and read a select group of said memory cells wherein one of N gate voltages representing a predetermined binary value is applied to the memory cell of said select group of cells until a predetermined current is reached, wherein each of said memory, read reference and write reference blocks having at least one row and one column of single transistor cells, each of said column of cells arranged in NAND type architecture having two select transistors and each of said cells having a floating gate for storing more than a single data bit of information within each cell.

21. A multi-level non-volatile memory system according to claim 20 further comprising address decode having row select logic coupled to said memory cells, read reference cells and write reference cells and further having column select logic coupled to said memory cells for selecting a memory cell for programming or reading wherein the selected cell is kept in saturation mode during reading of the same while remaining cells are maintained in linear mode.

22. A multi-level non-volatile memory system according to claim 20 further comprising column select logic coupled to said read reference blocks for selecting a column of read reference cells and further having column select logic coupled to said write reference blocks for selecting a column of write reference cells.

23. A multi-level non-volatile memory system according to claim 20 further comprising a counter coupled to said read and write column select logics for sequentially providing N logic states, each state representing one of said N reference voltages starting with logic state O and incrementing through to logic state N during programming of each of said memory, read and write reference cells and starting from logic state N and decrementing through to logic state O during reading of each of said memory, read and write reference cells.

24. A multi-level memory system according to claim 23 further comprising means coupled to an I/O bus for comparing during a memory programming operation a binary value to be programmed into a selected memory cell to the logic state provided by said counter and upon successful comparison thereof providing an output for disabling further programming of said selected memory cell.

25. A multi-level memory system according to claim 24 further comprising a storage means coupled between said I/O bus and said comparing means.

26. A multi-level non-volatile memory system according to claim 20 further comprising comparator circuitry having a first input coupled to said memory cells for receiving the current through a selected memory cell and a second input selectively coupled to receive the current through either a read reference cell corresponding to said selected memory cell during a memory read operation or the current through a write reference cell corresponding to said selected memory cells during a memory write operation.

27. A multi-level non-volatile memory system according to claims 21 or 22 further comprising a read reference comparator having a first input coupled to said read column select and a second input coupled to receive a predetermined current reference level for comparing said first and second inputs when verifying programming said read reference blocks during system initialization.

28. A multi-level non-volatile memory system according to claims 21 or 22 further comprising a write reference comparator having a first input coupled to said write column select and a second input selectively coupled to receive a predetermined current reference level when verifying programming said write reference blocks during system initialization or coupled to said read column select during reading of said memory array.

* * * * *